(12) United States Patent
Niimi et al.

(10) Patent No.: US 8,802,577 B2
(45) Date of Patent: Aug. 12, 2014

(54) METHOD FOR MANUFACTURING A SEMICONDUCTOR DEVICE USING A NITROGEN CONTAINING OXIDE LAYER

(75) Inventors: Hiroaki Niimi, Dallas, TX (US); Jarvis B. Jacobs, Murphy, TX (US); Reima Tapani Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/101,860

(22) Filed: May 5, 2011

(65) Prior Publication Data
US 2012/0028431 A1   Feb. 2, 2012

Related U.S. Application Data

(63) Continuation of application No. 11/359,120, filed on Feb. 21, 2006, now abandoned.

(51) Int. Cl.
*H01L 21/31* (2006.01)
*H01L 21/28* (2006.01)

(52) U.S. Cl.
CPC .... *H01L 21/28158* (2013.01); *H01L 21/28202* (2013.01)
USPC ........................................................ 438/775

(58) Field of Classification Search
CPC .................... H01L 21/28158; H01L 21/28202
USPC ........................................................ 438/775
See application file for complete search history.

(56) References Cited

U.S. PATENT DOCUMENTS

| | | |
|---|---|---|
| 5,405,791 A | 4/1995 | Ahmad et al. |
| 5,552,332 A | 9/1996 | Tseng et al. |
| 5,972,804 A | 10/1999 | Tobin et al. |
| 6,049,114 A | 4/2000 | Maiti et al. |
| 6,348,420 B1 | 2/2002 | Raaijmakers et al. |
| 6,548,366 B2 * | 4/2003 | Niimi et al. ................... 438/384 |
| 6,583,013 B1 | 6/2003 | Rodder et al. |
| 6,635,938 B1 * | 10/2003 | Nakahata et al. ............. 257/382 |
| 7,015,534 B2 | 3/2006 | Colombo |
| 7,091,119 B2 | 8/2006 | Colombo |
| 7,098,110 B2 * | 8/2006 | Saiki ............................. 438/301 |
| 7,456,115 B2 * | 11/2008 | Chou et al. .................... 438/775 |
| 2002/0072210 A1 | 6/2002 | Hsu et al. |
| 2003/0042526 A1 | 3/2003 | Weimer |
| 2004/0152253 A1 * | 8/2004 | Guo .............................. 438/224 |
| 2004/0159898 A1 | 8/2004 | Hattangady et al. |
| 2004/0209418 A1 | 10/2004 | Knoll et al. |
| 2005/0079696 A1 | 4/2005 | Colombo |
| 2005/0106797 A1 | 5/2005 | Colombo |
| 2006/0114736 A1 * | 6/2006 | Ozawa .......................... 365/222 |

* cited by examiner

*Primary Examiner* — David Vu
*Assistant Examiner* — Brandon Fox
(74) *Attorney, Agent, or Firm* — Alan A. R. Cooper; Frederick J. Telecky, Jr.

(57) ABSTRACT

The present invention provides a method for forming a semiconductor device, as well as a semiconductor device. The method for manufacturing a semiconductor device, among others, includes providing a gate structure (240) over a substrate (210), the gate structure (240) including a gate electrode (248) located over a nitrided gate dielectric (243), and forming a nitrided region (310) over a sidewall of the nitrided gate dielectric (243).

17 Claims, 5 Drawing Sheets

METHOD FOR MANUFACTURING A SEMICONDUCTOR DEVICE USING A NITROGEN CONTAINING OXIDE LAYER

This is a continuation of application Ser. No. 11/359,120 filed Feb. 21, 2006, the entirety of which is incorporated herein by reference.

The present invention is directed, in general, to a method for manufacturing a semiconductor device and, more specifically, to a method for manufacturing a semiconductor device using a nitrogen containing oxide layer.

BACKGROUND

The trend in semiconductor technology to double the functional complexity of its products every 18 months (e.g., Moore's "law") has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the package dimensions should shrink. And third, but not least, the increased functional complexity should be paralleled by an equivalent increase in reliability of the product.

The scaling of the components in the lateral dimension requires vertical scaling as well, so as to achieve adequate device performance. This vertical scaling requires the thickness of the gate dielectric, commonly silicon dioxide, to be reduced. Thinning of the silicon dioxide gate dielectric provides a smaller barrier to dopant diffusion from a polysilicon gate structure (or metal diffusion from a metal gate structure) through the underlying dielectric, often resulting in devices with diminished electrical performance (e.g., leakage) and reliability.

One well-established technique for mitigating the problems associated with silicon dioxide gate dielectrics includes using a nitrided gate dielectric (e.g., for example a silicon oxynitride gate dielectric, nitrided high-k dielectric, nitrided silicate gate dielectric, etc.) to raise the dielectric constant thereof. This allows the use of a thicker gate dielectric where a thinner dielectric would ordinarily be needed, providing for less leakage through the gate dielectric. Unfortunately, nitrided gate dielectrics are susceptible to having non-uniform nitrogen profiles therein, which negatively affect the reliability thereof.

Accordingly, what is needed in the art is a semiconductor device having a nitrided gate dielectric layer therein and a method of manufacture therefor which do not experience the drawbacks of the prior art.

SUMMARY

To address the above-discussed deficiencies of the prior art, the present invention provides a method for forming a semiconductor device, as well as a semiconductor device. The method for manufacturing a semiconductor device, among others, includes providing a gate structure over a substrate, the gate structure including a gate electrode located over a nitrided gate dielectric, and forming a nitride region in a sidewall of the nitrided gate dielectric.

Another embodiment of the present invention is a semiconductor device. The semiconductor device includes a gate structure positioned over a substrate, the gate structure including a gate electrode located over a nitrided gate dielectric, and a nitride region located in a sidewall of the nitrided gate dielectric.

BRIEF DESCRIPTION OF THE DRAWINGS

For a more complete understanding of the present invention, reference is now made to the following descriptions taken in conjunction with the accompanying drawings, in which.

DETAILED DESCRIPTION OF EXAMPLE EMBODIMENTS

The present invention is based, at least in part, on the recognition that the conventional formation of an oxide liner (e.g., poly-Si oxidation) surrounding the gate electrode and nitrided gate dielectric layer of a gate structure tends to change the doping profile of the nitrogen located within the nitrided gate dielectric layer. The present invention has particularly recognized that the conventional formation of the oxide liner decreases the nitrogen concentration profile at the edge, as compared to the center of the nitrided gate dielectric layer.

Given these recognitions, the present invention acknowledges that a nitrogen containing oxide layer, alone or in combination with a nitride region in the sidewall of the nitrided gate dielectric layer, can be used to improve the uniformity of the nitrogen across a length of the nitrided gate dielectric layer. Without this nitrogen containing oxide layer, whether recognized in the art or not, the nitrided gate dielectric layer would have lower amounts of nitrogen at its edge than center.

Figure 1:
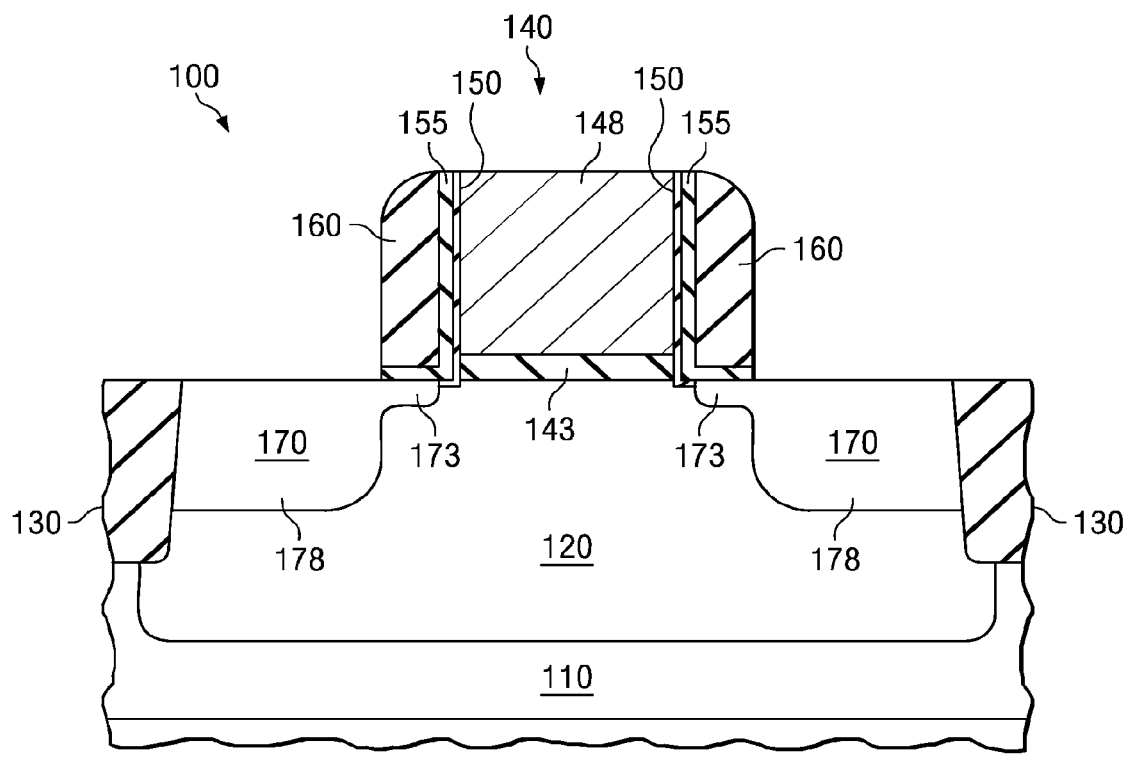
FIG. 1 illustrates a sectional view of a semiconductor device manufactured in accordance with the principles of the present invention.

Turning now to FIG. 1, illustrated is a sectional view of a semiconductor device 100 manufactured in accordance with the principles of the present invention. The semiconductor device 100 initially includes a substrate 110. Located within the substrate 110 in the embodiment of FIG. 1 is a well region 120, and isolation structures 130. The well region 120 and isolation structures 130 may be conventional features.

Additionally located over the substrate 110 and well region 120 is a gate structure 140. The gate structure 140 illustrated in FIG. 1 includes a nitrided gate dielectric 143 located over the substrate 110, as well as a gate electrode 148 located over the nitrided gate dielectric 143. Those skilled in the art appreciate the various different types of materials that the gate electrode 148 and nitrided gate dielectric 143 may comprise. For example, while the nitrided gate dielectric 143 illustrated in FIG. 1 comprises a silicon oxynitride gate dielectric, other nitrogen containing dielectrics, such as nitrided high-K dielectrics, nitrided silicate gate dielectrics, etc, may be used. Those skilled in the art further appreciate that the thicknesses of each of the nitrided gate dielectric 143 and gate electrode 148 may vary according to the design rules of the semiconductor device 100.

Located in the sidewall of the nitrided gate dielectric 143 is a nitride region 150. In the embodiment of FIG. 1, the nitride region 150 is actually located along all of the sidewalls of the nitrided gate dielectric 143 as well as along all of the sidewalls of the gate electrode 148. The nitride region 150 may embody a number of different thicknesses. However, one particular embodiment uses a nitride region 150 thickness ranging from about 0.5 nm to about 1.0 nm. Other thicknesses nevertheless might be used.

The nitride region 150, in one embodiment, contains a sufficient amount of nitrogen therein to reduce the aforementioned drop-off in the nitrogen profile at the edge of the nitrided gate dielectric 143. For example, in one embodiment the nitride region 150 contains from about 5 atomic percent to about 10 atomic percent of nitrogen therein. However, the present invention should not be limited to any specific amount of nitrogen. Accordingly, edges of the nitrided gate dielectric 143 may ultimately have substantially the same concentration of nitrogen that a center of the nitrided gate dielectric 143 would have. Alternatively, the amount of nitrogen in the nitride region 150 may be such that the edges of the nitrided gate dielectric 143 have a higher amount of nitrogen than a center of the nitrided gate dielectric 143 would have.

Positioned over the nitride region 150 is a nitrogen containing oxide layer 155. In the embodiment shown, the nitrogen containing oxide layer 155 is located along all of the sidewalls of the nitrided gate dielectric 143 as well as along all of the sidewalls of the gate electrode 148. Accordingly, the nitride region 150 of FIG. 1 completely separates the nitrogen containing oxide layer 155 from the nitrided gate dielectric 143 and gate electrode 148. Similar to the nitride region 150, the nitrogen containing oxide layer 155 may embody a number of different thicknesses. However, one particular embodiment uses a nitrogen containing oxide layer 155 thickness ranging from about 1.0 nm to about 1.5 nm. Other thicknesses nevertheless might be used.

The gate structure 140 further contains gate sidewall spacers 160 located on both sides of the nitrided gate dielectric 143 and gate electrode 148. While the gate sidewall spacers 160 of FIG. 1 include only a single anisotropically etched oxide or nitride portion, other embodiments exist wherein the gate sidewall spacers each include a number of different layers. Thus, the gate sidewall spacers 160 may comprise many different types and numbers of layers while staying consistent with the principles of the present invention.

The semiconductor device 100 illustrated in FIG. 1 additionally includes source/drain regions 170 located within the substrate 110 and proximate the nitrided gate dielectric 143. The source/drain regions 170 may be conventional. Accordingly, in one embodiment the source/drain regions 170 each include an extension portion 173 and a heavier doped portion 178.

Figure 2:
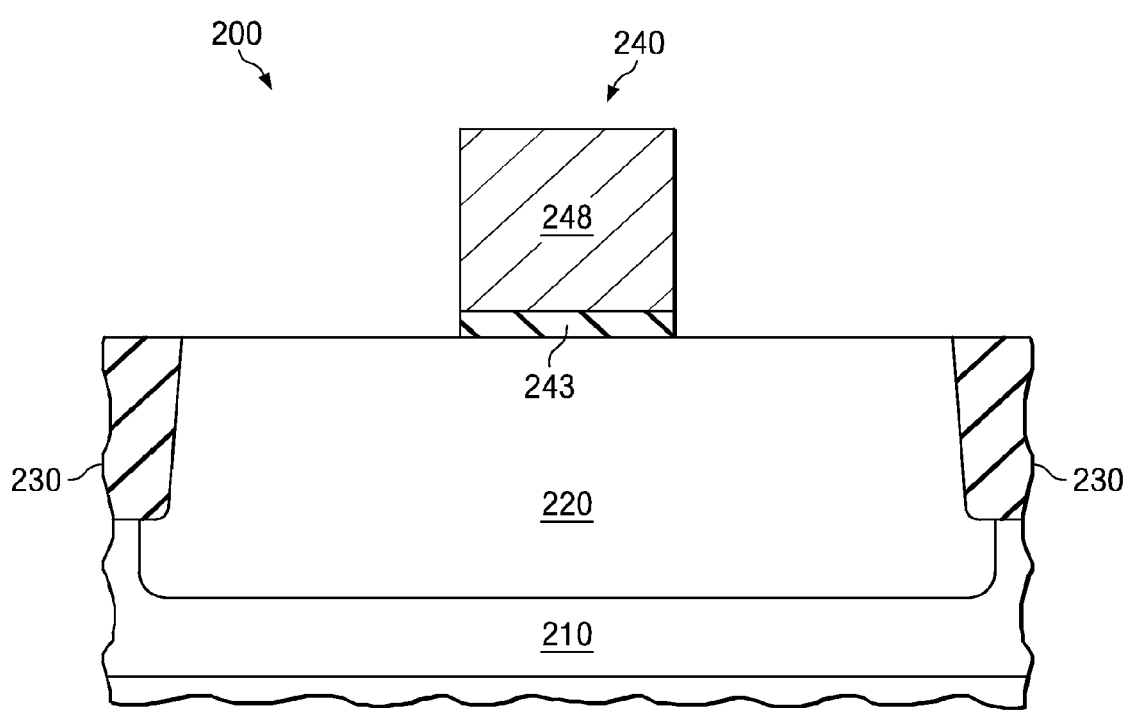
FIGS. 2-7 illustrate sectional views showing how one might, in an advantageous embodiment, manufacture a semiconductor device similar to the semiconductor device depicted in FIG. 1.

Turning now to FIGS. 2-7, illustrated are sectional views showing how one might, in an advantageous embodiment, manufacture a semiconductor device similar to the semiconductor device 100 depicted in FIG. 1. FIG. 2 illustrates a sectional view of a partially completed semiconductor device 200 manufactured in accordance with the principles of the present invention. The semiconductor device 200 of FIG. 2 includes a substrate 210. The substrate 210 may, in an exemplary embodiment, be any layer located in the semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, should generally contain an N-type dopant. For example, the well region 220 would likely be doped with an N-type dopant dose ranging from about 1E13 atoms/cm$^2$ to about 1E14 atoms/cm$^2$ and at an energy ranging from about 100 keV to about 500 keV. This results in the well region 220 having a peak dopant concentration ranging from about 5E17 atoms/cm$^3$ to about 1E19 atoms/cm$^3$.

Located within the substrate 210 proximate the well region 220 are isolation structures 230. The isolation structures 230 are generally used to isolate the semiconductor device 200 illustrated in FIG. 2 from other devices located proximate thereto. In the embodiment of FIG. 2, the isolation structures 230 are shallow trench isolation structures. However, those skilled in the art appreciate that other isolation structures, such as field oxide isolation structures, etc., may also be used.

Located over the substrate 210 in the embodiment of FIG. 2 is a gate structure 240. The gate structure 240 includes a nitrided gate dielectric 243 and a gate electrode 248. The nitrided gate dielectric 243 may comprise a number of different thicknesses and stay within the scope of the present invention. In the illustrative embodiment of FIG. 2, however, the nitrided gate dielectric 243 has a thickness ranging from about 0.5 nm to about 5 nm.

The nitrided gate dielectric 243 may, again, comprise many different nitrogen containing gate dielectric materials. For example, the nitrided gate dielectric 243 may comprise a silicon oxynitride gate dielectric, a nitrided high-k gate dielectric, a nitrided silicate gate dielectric, among others. In the embodiment of FIGS. 2-7, however, the nitrided gate dielectric 243 comprises a silicon oxynitride gate dielectric.

Any one of a plurality of manufacturing techniques could be used to form the nitrided gate dielectric 243. In the example wherein the nitrided gate dielectric 243 is a silicon oxynitride gate dielectric, such as shown in FIGS. 2-7, the silicon oxynitride gate dielectric could be formed by first growing or depositing a silicon dioxide gate dielectric layer, and thereafter subjecting the silicon dioxide gate dielectric layer to a nitrogen containing plasma source to introduce the nitrogen into the silicon dioxide gate dielectric layer. However, those skilled in the art of silicon oxynitride gate dielectrics would understand the other processes, conventional or not, that might be used to form the silicon oxynitride gate dielectric.

The gate electrode 248, in one embodiment, may comprise a conventional polysilicon gate electrode. Alternatively, however, the gate electrode 248 might comprise an amorphous polysilicon gate electrode, or even possibly a partially or fully silicided gate electrode or metal gate electrode. Accordingly, the present invention should not be limited to any specific gate electrode material.

In the embodiment wherein the gate electrode 248 comprises a polysilicon gate electrode, the polysilicon gate electrode could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_h$ or $Si_2H_6$ gas flow ranging from about 100 sccm to about 300 sccm. In any instance, the gate electrode 248 desirably has a thickness ranging from about 50 nm to about 150 nm.

Figure 3:
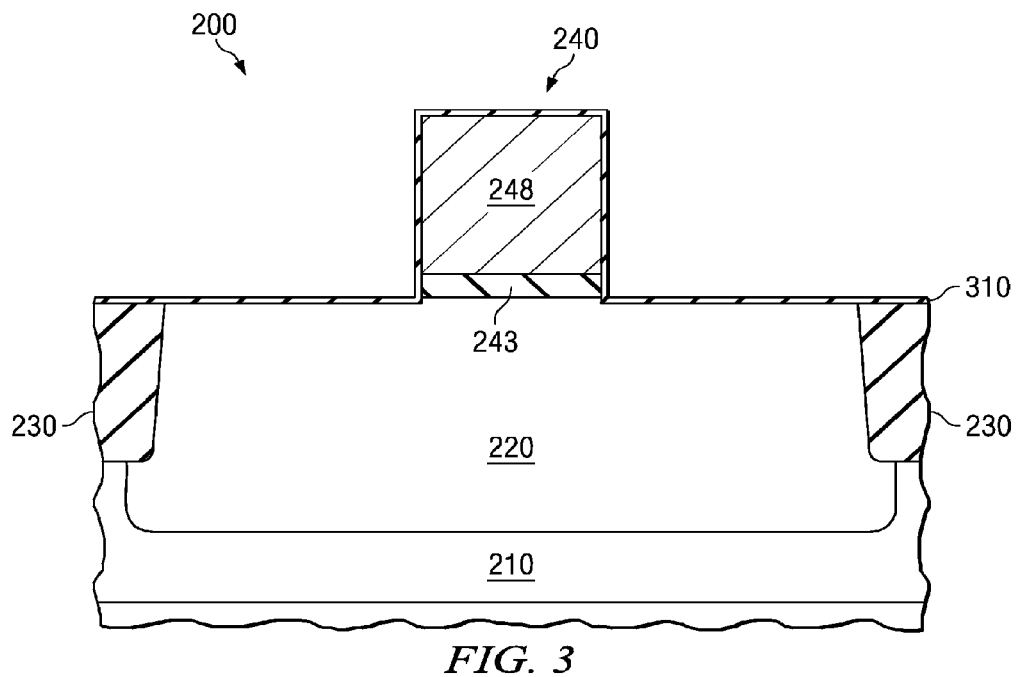

Turning now to FIG. 3, illustrated is a sectional view of the semiconductor device 200 of FIG. 2 after forming a nitride region 310 in a sidewall of the nitrided gate dielectric 243. In the given embodiment of FIG. 3, the nitride region 310 is not only formed in the sidewall of the nitrided gate dielectric 243, but is formed entirely along the sidewalls of the nitrided gate dielectric 243, entirely along the sidewalls of the gate electrode 248, and along the exposed upper surface of the substrate 210. Accordingly, the nitride region 310 of FIG. 3 is somewhat of a conformal nitride region. The nitride region 310, in accordance with the principles of the present invention, would generally have a thickness ranging from about 0.5 nm to about 1.0 nm, and a nitrogen concentration ranging from about 5 atomic percent to about 10 atomic percent. Other thicknesses and nitrogen concentrations could nonetheless also be used and remain within the purview of the present invention.

The nitride region 310 may be formed using various different processes. In one embodiment, the nitride region 310 is formed by subjecting the semiconductor device 200 to a nitrogen containing plasma. For instance, the nitrogen containing plasma might be a pulse RF plasma using a flow rate of nitrogen gas ranging from about 50 sccm to about 100 sccm, a pressure ranging from about 20 mTorr to about 40 mTorr, an RF power ranging from about 800 Watts to about 1200 Watts, a duty cycle (e.g., the ratio of the sum of all pulse durations during a specified period of continuous operation to the total specified period of operation) ranging from about 5% to about 10%, a pulse frequency ranging from about 0.5 kHz to 1.5 kHz, for a time period ranging from about 5 seconds to about 15 seconds. Alternatively, the nitrogen containing plasma might be a microwave plasma using a flow rate of nitrogen gas ranging from about 100 sccm to about 300 sccm, a flow rate of an inert gas (e.g., argon) ranging from about 1000 sccm to about 2000 sccm, a pressure ranging from about 500 mTorr to about 2 Torr, a microwave power ranging from about 500 Watts to about 1500 Watts, at a temperature ranging from about 200° C. to about 500° C., for a time period ranging from about 5 seconds to about 15 seconds. Other conditions outside of the aforementioned ranges could also be used.

After completing the formation of the nitride region 310, the nitride region 310, and more particularly the nitrided gate dielectric 243 and gate electrode 248, may be subjected to a reoxidation step. The reoxidation step is configured to remove damage, particularly plasma damage, which may have been caused during the formation of the nitride region 310. In one embodiment, the reoxidation step is a low-temperature reoxidation process. For example, the low temperature reoxidation process might include subjecting the semiconductor device 200 to about 1% to about 50% oxygen gas ($O_2$) in nitrogen gas ($N_2$) for a time period ranging from about 30 seconds to about 60 seconds, in the presence of a pressure ranging from about 700 Torr to about 800 Torr and a temperature ranging from about 400° C. to about 600° C. However, other processing conditions could also be used.

Figure 4:
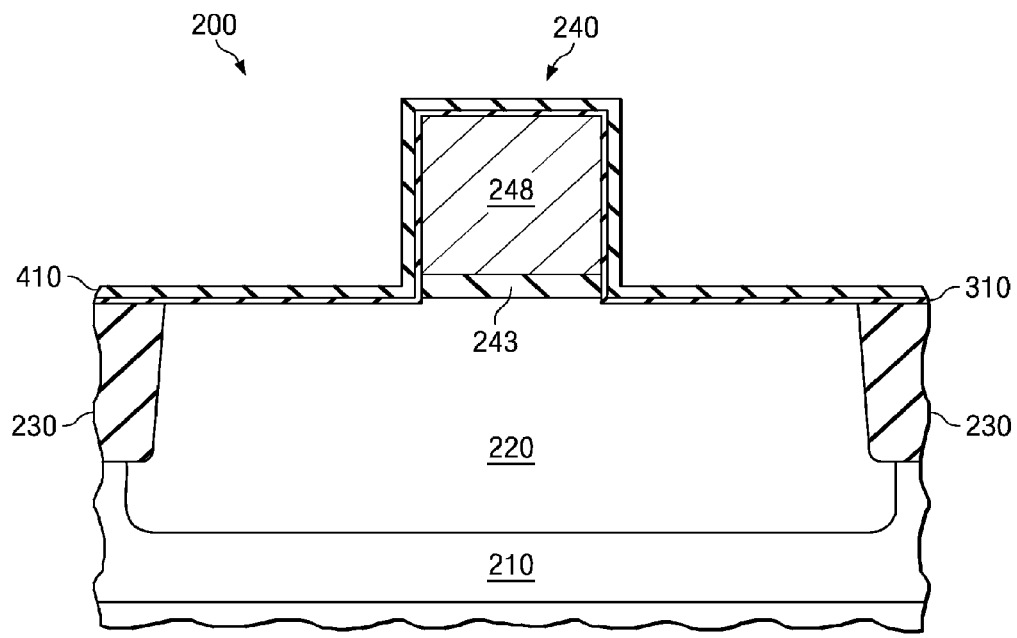

Turning now to FIG. 4, illustrated is a sectional view of the semiconductor device 200 of FIG. 3 after forming a nitrogen containing oxide layer 410 over a sidewall of the nitrided gate dielectric 243. In the given embodiment of FIG. 4, the nitrogen containing oxide layer 410 is not only formed over the sidewall of the nitrided gate dielectric 243, but is formed entirely along the sidewalls of the nitrided gate dielectric 243, entirely along the sidewalls of the gate electrode 248, and along the exposed upper surface of the substrate 210, the nitride region 310 separating the nitrogen containing oxide layer 410 from each of those layers. Accordingly, the nitrogen containing oxide layer 410 of FIG. 4 is also somewhat of a conformal layer. The nitrogen containing oxide layer 410, in accordance with the principles of the present invention, would generally have a thickness ranging from about 1.0 nm to about 1.5 nm. Other thicknesses could nonetheless also be used and remain within the purview of the present invention.

The nitrogen containing oxide layer 410 may be formed using various different processes. However, in one embodiment the nitrogen containing oxide layer 410 is formed by the oxynitridation of the nitride region 310 in the presence of a nitrogen containing gas. For instance, the oxynitridation might occur in the presence of nitrous oxide ($N_2O$) gas or nitric oxide (NO) gas or its mixtures, among others. The formation of the oxide layer might occur in the presence of a temperature ranging from about 700° C. to about 1000° C., a pressure ranging from about 50 Torr to about 500 Torr, for a time period ranging from about 30 seconds to about 60 seconds. Other conditions outside of the aforementioned ranges could also be used, as well as the nitrogen containing oxide layer 410 might be deposited in an alternative embodiment. The resulting stack of the nitride region 310 and the nitrogen containing oxide layer 410 should, desirably, have a thickness ranging from about 1.5 nm to about 2.5 nm.

Figure 5:
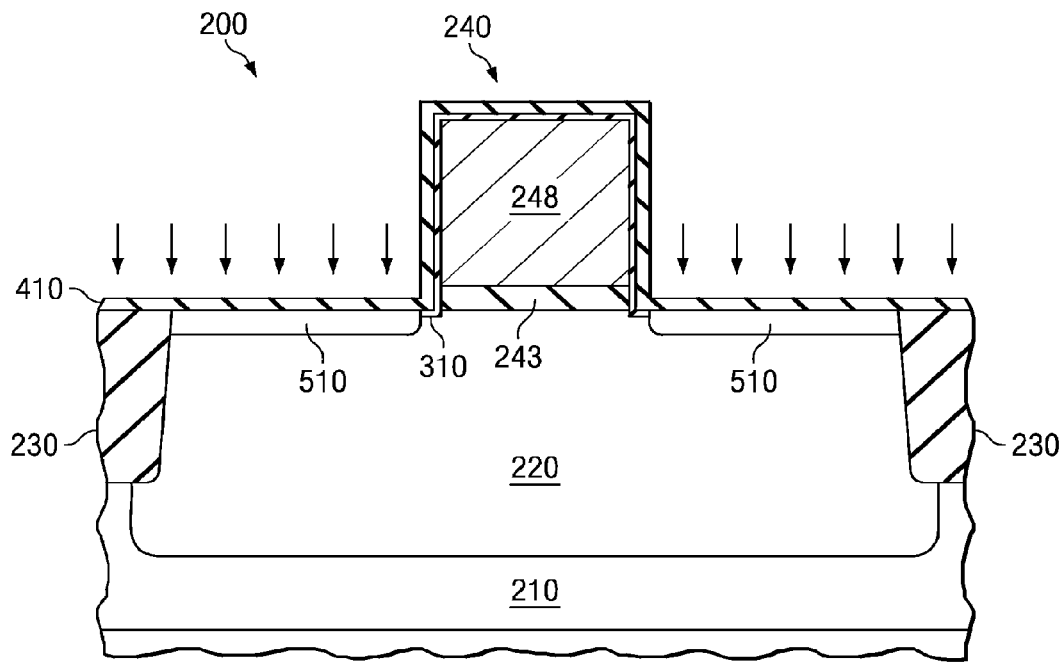

Turning now to FIG. 5, illustrated is a sectional view of the semiconductor device 200 illustrated in FIG. 4 after formation of extension implants 510 within the substrate 210. The extension implants 510 may be conventionally formed and generally have a peak dopant concentration ranging from about 1E19 atoms/cm$^3$ to about 2E20 atoms/cm$^3$. As is standard in the industry, the extension implants 510 have a dopant type opposite to that of the well region 220 they are located within. Accordingly, the extension implants 510 are doped with a P-type dopant in the illustrative embodiment shown in FIG. 5.

Figure 6:
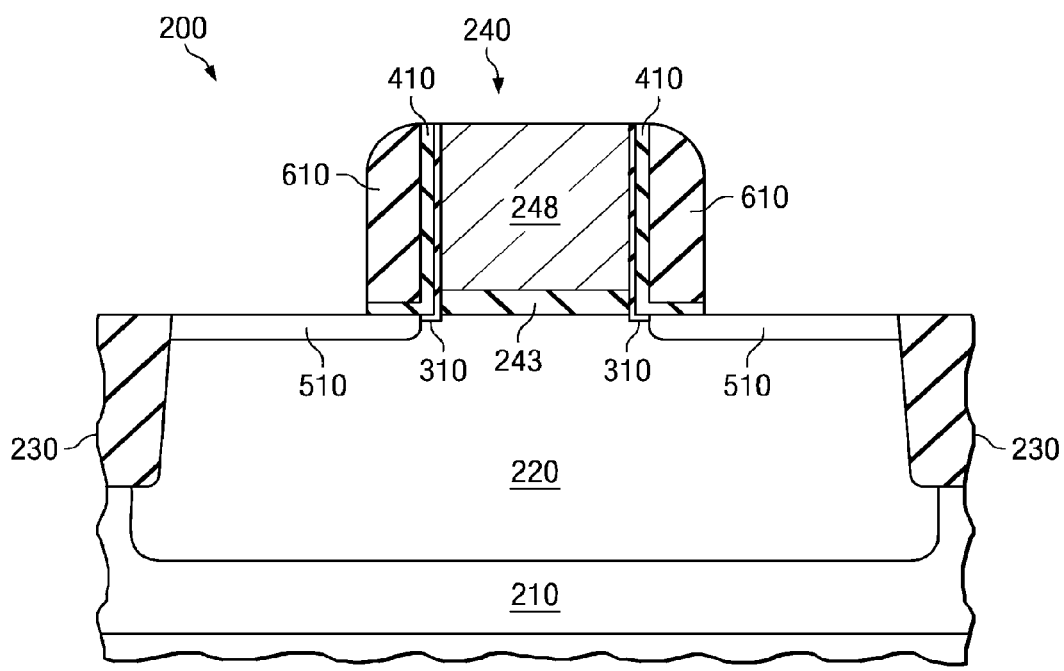

Turning now to FIG. 6, illustrated is a sectional view of the semiconductor device 200 illustrated in FIG. 5 after forming gate sidewall spacers 610. In the given embodiment of FIG. 6, the gate sidewall spacers 610 comprise an oxide. For example, a blanket oxide layer may be deposited, and then subjected to an anisotropic etch, thereby resulting in the gate sidewall spacers 610, nitride region 310, and nitrogen containing oxide layer 410 illustrated in FIG. 6. Nevertheless, the gate sidewall spacers 610 may comprise other materials, as well as be forming using other processes than disclosed above.

Figure 7:
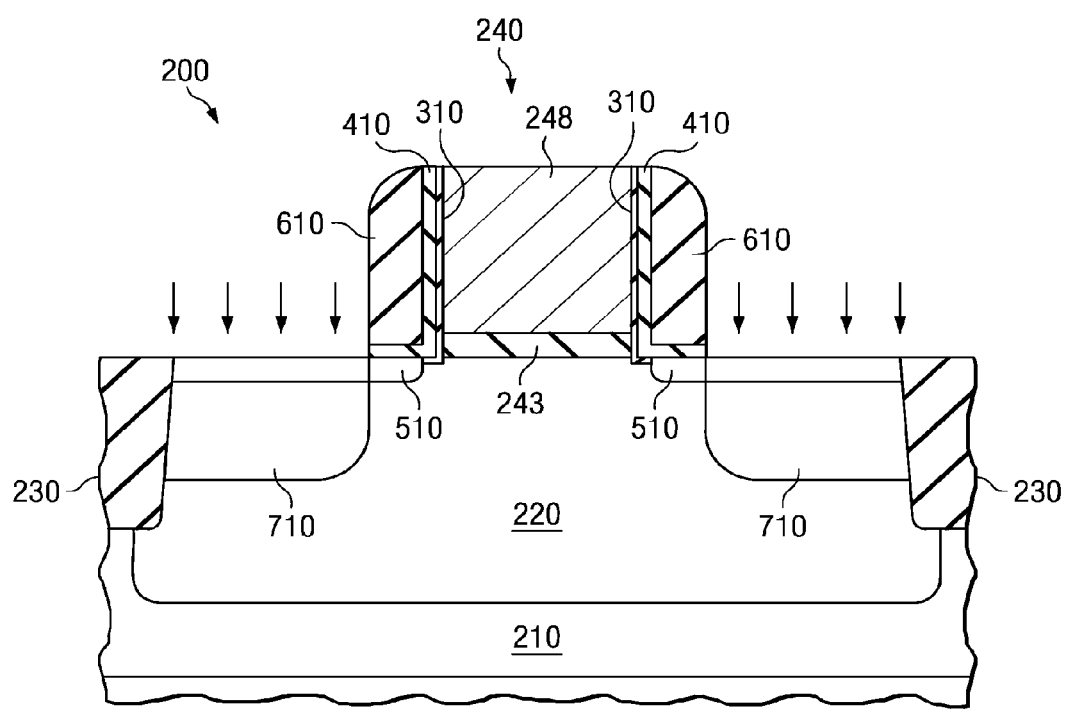

Turning now to FIG. 7, illustrated is a sectional view of the semiconductor device 200 of FIG. 6 after forming highly doped source/drain implants 710 within the substrate 210. The formation of the highly doped source/drain implants 710 may be conventional. Generally the highly doped source/drain implants 710 have a peak dopant concentration ranging from about 1E18 atoms/cm$^3$ to about 1E21 atoms/cm$^3$. Also, the highly doped source/drain implants 710 should typically have a dopant type opposite to that of the well region 220 they are located within. Accordingly, in the illustrative embodiment shown in FIG. 7, the highly doped source/drain implants 710 are doped with a P-type dopant.

After formation of the highly doped source/drain implants 710, the semiconductor device 200 may be subjected to a standard source/drain anneal, thereby activating source/drain regions. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions. What results, at least after various other well-known processing steps, is a semiconductor device substantially similar to the semiconductor device 100 shown and discussed with respect to FIG. 1.

It should be noted that the exact order of the steps illustrated with respect to FIGS. 2-7 may change depending on the process flow. Additionally, various other steps could be added to the description of FIGS. 2-7. Accordingly, the present invention should not be limited by the disclosures made above with respect to FIGS. 2-7.

The method of manufacturing the semiconductor device as discussed with respect to FIGS. 2-7 provides many benefits over the prior art methods. First, and possibly most important, it improves transistor performance as critical dimensions (CD) and poly oxide thickness is scaled, for example by reducing nitrogen atom loss from the edge of the nitrided gate dielectric. Additionally, the process flow according to the present invention is compatible with conventional process flows. Moreover, the idea can be integrated into a single cluster tool.

Figure 8:
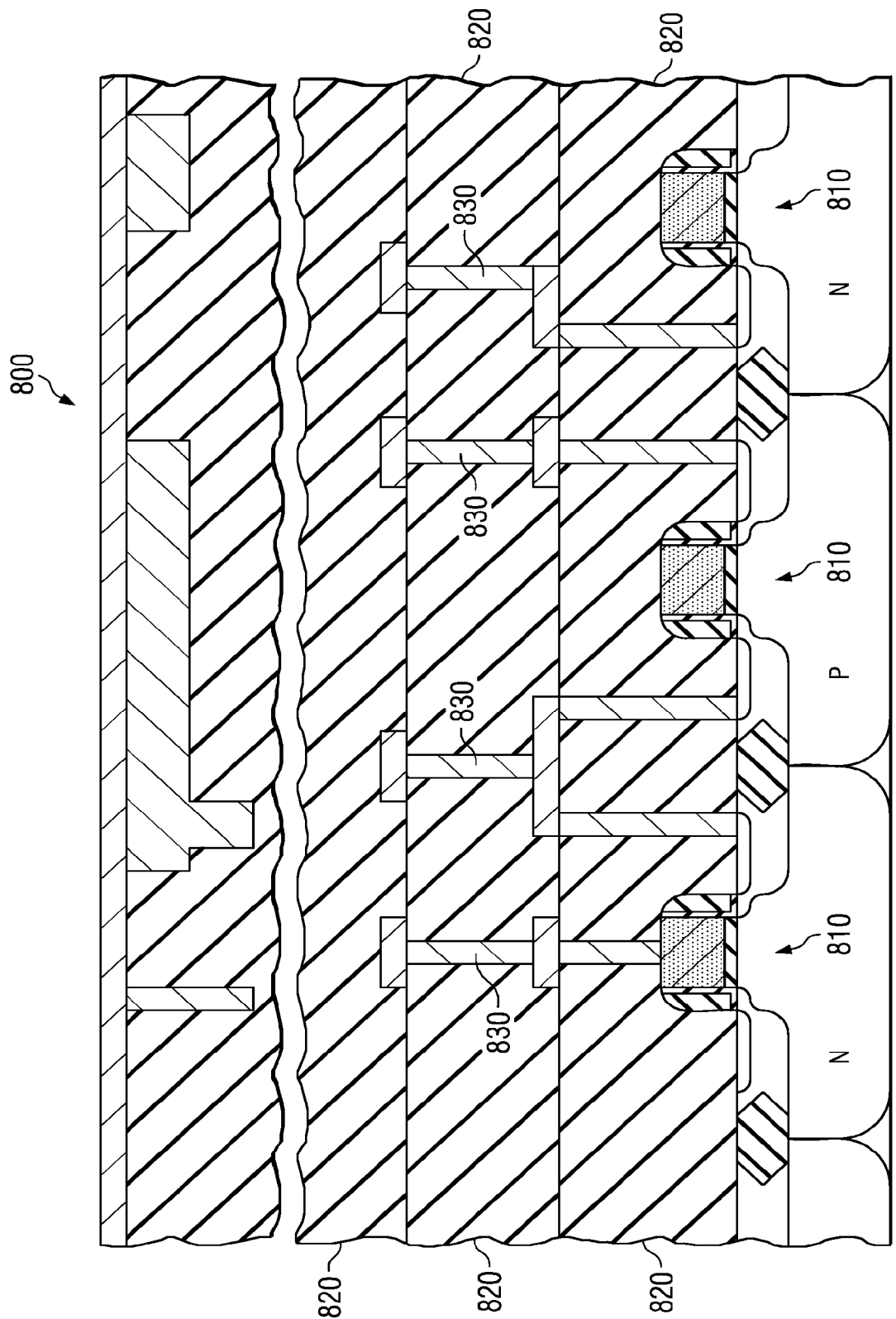
FIG. 8 illustrates a sectional view of an integrated circuit (IC) incorporating semiconductor devices constructed according to the principles of the present invention.

Referring finally to FIG. 8, illustrated is a sectional view of an integrated circuit (IC) 800 incorporating semiconductor devices 810 constructed according to the principles of the present invention. The IC 800 may include devices, such as transistors used to form CMOS devices, BiCMOS devices, Bipolar devices, as well as capacitors or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the semiconductor devices 810 having dielectric layers 820 located thereover. Additionally, interconnect structures 830 are located within the dielectric layers 820 to interconnect various devices, thus, forming the operational integrated circuit 800.

Although the present invention has been described in detail, those skilled in the art should understand that they can make various changes or substitutions herein without departing from the spirit and scope of the invention in its broadest form.

What is claimed is:

1. A method for manufacturing a semiconductor device, comprising:
   providing a patterned gate structure over a substrate, the patterned gate structure including a polysilicon gate electrode located over a nitrided gate dielectric; the nitrided gate dielectric having a substantially same nitrogen concentration at edges as at a center;
   prior to oxidation of the polysilicon gate electrode, subjecting the patterned gate structure to nitridation using a nitrogen containing plasma to incorporate additional nitrogen atoms into edges of the nitrided gate dielectric, wherein the nitride region is located along all of the sidewalls of the gate dielectric and also along all of the sidewalls of the polysilicon gate electrode and along the top surface of the substrate;
   after subjecting the gate structure to the nitridation, subjecting the patterned gate structure to an oxidant containing nitrogen gas for oxidation of the polysilicon gate electrode to generate a nitrogen containing oxide layer along all of the sidewalls of the nitride gate dielectric and along the top surface of the substrate;
   after oxidation of the polysilicon gate electrode, forming sidewalls on the patterned gate structure; and
   forming source/drain implants in the substrate adjacent the sidewalls,
   the nitridation serving to compensate for loss of nitrogen atoms at the edges of the nitrided gate dielectric during oxidation.

2. The method of claim 1, wherein the nitrided gate dielectric comprises silicon oxynitride.

3. The method of claim 2, wherein the silicon oxynitride gate dielectric has a thickness within a range of 0.5 nm to 5 nm.

4. The method of claim 1, wherein the nitrided gate dielectric is formed by growing or depositing a silicon dioxide layer over the substrate, and subjecting the silicon dioxide layer to nitridation using a nitrogen containing plasma to introduce nitrogen atoms into the silicon dioxide layer.

5. The method of claim 1, wherein the oxidant is $N_2O$ or NO.

6. The method of claim 1, wherein the nitrogen containing plasma comprises nitrogen gas and argon gas.

7. A method for manufacturing a semiconductor device, comprising:
   forming a silicon oxynitride dielectric layer by growing or depositing a silicon dioxide layer over a substrate and subjecting the silicon dioxide layer to nitridation using a nitrogen containing plasma to introduce nitrogen atoms into the silicon dioxide layer;
   forming a polysilicon layer over the silicon oxynitride layer;
   patterning the polysilicon and silicon oxynitride layers to form a gate structure including a polysilicon gate electrode over a silicon oxynitride dielectric; the silicon oxynitride gate electrode having a substantially same nitrogen concentration at edges as at a center;
   prior to oxidation of the polysilicon gate electrode, subjecting the gate structure to further nitridation using a nitrogen containing plasma to incorporate additional nitrogen atoms into edges of the silicon oxynitride gate dielectric, wherein the nitride region is located along all of the sidewalls of the gate dielectric and also along all of the sidewalls of the polysilicon gate electrode and along the top surface of the substrate;
   after subjecting the gate structure to the further nitridation, subjecting the gate structure to an oxidant comprising $N_2O$ or NO for oxidation of the polysilicon gate electrode to generate a nitrogen containing oxide layer along all of the sidewalls of the nitride gate dielectric and along the top surface of the substrate;
   after oxidation of the polysilicon gate electrode, forming sidewalls on the gate structure; and
   forming source/drain implants in the substrate adjacent the sidewalls,
   the nitridation serving to compensate for loss of nitrogen atoms at the edges of the silicon oxynitride gate dielectric during oxidation.

8. The method of claim 7, wherein the silicon oxynitride gate dielectric has a thickness within a range of 0.5 nm to 5 nm.

9. The method of claim 7, wherein the nitrogen containing plasma for the further nitridation comprises nitrogen gas and argon gas.

10. A method for manufacturing a semiconductor device, comprising:
    forming a gate structure over a substrate, the gate structure including a nitrided gate dielectric located over the substrate and a gate electrode located over the nitrided gate dielectric electrode and along the top surface of the substrate;
    prior to an oxidation of the gate electrode, forming a nitride region using a nitrogen containing plasma conformally entirely along sidewalls of the nitrided gate dielectric, entirely along sidewalls of the gate electrode, and along an exposed upper surface of the substrate and also along all of the sidewalls of the gate electrode and along the top surface of the substrate;

after subjecting the gate structure to nitration, forming a nitrogen containing oxygen layer conformally over the nitride region entirely along the sidewalls of the nitrided gate dielectric, entirely along the sidewalls of the gate electrode, and along the upper surface of the substrate with the nitride region separating the nitrogen containing oxide layer from the exposed upper surface of the substrate, wherein the oxidation of the gate electrode includes the forming the nitrogen containing oxygen layer, wherein the nitrided gate dielectric is formed by forming a silicon dioxide gate dielectric layer over the substrate, and thereafter subjecting the silicon dioxide gate dielectric layer to a nitrogen containing plasma source to introduce nitrogen into the silicon dioxide gate dielectric layer, the forming of the nitride region serving to compensate for loss of nitrogen atoms at the edges of the nitrided gate dielectric during oxidation.

11. The method of claim 10, wherein the nitrided gate dielectric comprises silicon oxynitride.

12. The method of claim 11, wherein the nitride region is formed by subjecting the semiconductor device to a nitrogen containing plasma.

13. The method of claim 12, wherein the nitrogen containing oxide layer is formed by oxynitridation of the nitride region in the presence of a nitrogen containing gas.

14. The method of claim 13, wherein the nitrided gate dielectric is formed to thickness of 0.5-5 nm; the nitride region is formed to a thickness of 0.5-1.0 nm and a nitrogen concentration of 5-10 atomic percent; and the nitrogen containing oxide layer is formed to a thickness of 1.0-1.5 nm.

15. The method of claim 13, further comprising, after completing formation of the nitride region, subjecting the nitrided gate dielectric and gate electrode to a reoxidation process.

16. The method of claim 15, wherein the reoxidation step comprises subjecting the device to about 1-50% oxygen gas in nitrogen gas for a time period of 30-60 secs at a temperature of 400-600° C.

17. The method of claim 15, further comprising forming extension implants within the substrate adjacent the gate structure; after forming the extension implants, forming gate sidewall spacers over the gate structure; after forming the gate sidewall spacers, forming source/drain implants within the substrate adjacent the sidewall spacers; and performing an anneal to activate the source/drain implants.

* * * * *